United States Patent [19]

Matsuo

[11] Patent Number: 4,972,518
[45] Date of Patent: Nov. 20, 1990

[54] LOGIC INTEGRATED CIRCUIT HAVING INPUT AND OUTPUT FLIP-FLOPS TO STABILIZE PULSE DURATIONS

[75] Inventor: Hiroyuki Matsuo, Tokyo, Japan

[73] Assignee: NEC Corporation, Tokyo, Japan

[21] Appl. No.: 386,022

[22] Filed: Jul. 25, 1989

Related U.S. Application Data

[63] Continuation of Ser. No. 134,065, Dec. 17, 1987, abandoned.

[30] Foreign Application Priority Data

Dec. 19, 1986 [JP] Japan ............................ 61-301501
Jan. 12, 1987 [JP] Japan ............................ 62-3280

[51] Int. Cl.$^5$ ............................................. H03K 19/00
[52] U.S. Cl. ................................... 307/480; 307/272.1; 307/465; 307/269
[58] Field of Search ............. 307/480, 272.1, 445, 307/475, 590, 465, 269, 267; 340/825.5; 364/716

[56] References Cited

U.S. PATENT DOCUMENTS

| | | | |
|---|---|---|---|
| 3,670,249 | 6/1972 | Mestener | 307/269 |
| 3,921,079 | 11/1975 | Heffner et al. | 328/62 |
| 3,942,124 | 3/1976 | Tarcy-Hornoch | 307/269 |
| 3,947,697 | 3/1976 | Archer et al. | 307/269 |
| 4,286,173 | 8/1981 | Oka et al. | 307/465 |
| 4,337,433 | 6/1982 | Yoshimura | 328/55 |
| 4,380,083 | 4/1983 | Andersson et al. | 307/480 |
| 4,398,208 | 8/1983 | Murano et al. | 357/81 |
| 4,423,383 | 12/1983 | Svendsen | 328/63 |
| 4,562,427 | 12/1985 | Teton | 307/465 |
| 4,636,656 | 1/1987 | Snowden et al. | 307/480 |
| 4,638,256 | 1/1987 | Hong et al. | 328/105 |
| 4,661,922 | 4/1987 | Flüerbach | 307/465 X |
| 4,686,480 | 8/1987 | Katto et al. | 328/62 |
| 4,700,350 | 10/1987 | Douglas et al. | 371/37 |
| 4,719,365 | 1/1988 | Misono | 307/480 |
| 4,772,888 | 9/1988 | Kimura | 307/480 |
| 4,839,604 | 6/1989 | Tanahashi | 307/480 X |

OTHER PUBLICATIONS

Mead et al., the textbook "Introduction to VLSI System", section 6.2, Addison Wesley Publishing Company Inc., Philippines, 1980, pp. 190-192.

Primary Examiner—Stanley D. Miller
Assistant Examiner—Huy K. Mai
Attorney, Agent, or Firm—Burns, Doane, Swecker & Mathis

[57] ABSTRACT

A logic integrated circuit comprises a logic circuit, an input-stage flip-flop connected to the input of the logic circuit and an output-stage flip-flop connected to the output of the logic circuit. Each of the input- and output-stage flip-flops is responsive to a clock pulse to change their output logic states depending on their input logic states, so that an output pulse generated by each of the flip-flops has a duration which is determined exclusively by the interval between successive clock pulses.

1 Claim, 2 Drawing Sheets

LOGIC INTEGRATED CIRCUIT HAVING INPUT AND OUTPUT FLIP-FLOPS TO STABILIZE PULSE DURATIONS

This application is a continuation of application Ser. No. 07/134,065, filed Dec. 17, 1987, now abandoned.

BACKGROUND OF THE INVENTION

The present invention relates generally to data processors, and more specifically to logic integrated circuits capable of high speed operation.

In prior art data processors wherein a plurality of logic integrated circuits are interconnected in a variety of ways, some of a group of logical paths that extend to a given destination logic gate may go through a greater number of intermediate logic gates than other logical paths of the same group. Such variability can result in pulses arriving at different times at the destination gate due to different delay times, resulting in a shortening of the time "window" in which coincidence must occur between different logical paths. Therefore, the pulse duration at the output of the destination gate is likely to become much narrower than is required if the operating speed, or clock frequency of the processor increases. As a result, information bits to be transmitted to a desired internal flip-flop of the integrated circuit chip are contaminated by noise caused by reflections from impedance mismatches along the logic paths or by crosstalks from external sources. Similar problems occur within a single logic integrated circuit since many logic gates are connected in a variety of combinations and hence input pulses to the output port of the integrated circuit may encounter different delays before arriving at the same output port. Therefore, the pulse duration of the output of the integrated circuit is likely to become considerably short in comparison with the clock interval.

SUMMARY OF THE INVENTION

It is therefore an object of the present invention to provide a reliable logic integrated circuit that operates with constant pulse durations and a data processor utilizing a plurality of such integrated circuits.

The present invention provides a logic integrated circuit which comprises a logic circuit, an input flip-flop connected to an input of the logic circuit and an output flip-flop connected to an output of the logic circuit, each of the input and output flip-flops being responsive to clock pulses to change their output logic states depending on their input logic states, whereby an input pulse supplied from said input flip-flop to the logic circuit and an output pulse supplied from said output flip-flop have a duration exclusively determined by the interval between successive clock pulses.

The present invention further provides a data processor comprising a clock source for generating clock pulses, a plurality of integrated circuits, and means for interconnecting the integrated circuits. Each of the integrated circuits comprises a logic circuit, an input flop-flop connected to an input of the logic circuit and an output flip-flop connected to an output of the logic circuit, each of the input and output flip-flops being responsive to the clock pulses to change their output logic states depending on their input logic states, whereby an input pulse supplied from said input flip-flop to the logic circuit and an output pulse supplied from said output flip-flop have a duration exclusively determined by the interval between successive clock pulses.

Because of the constant pulse durations, the allowance for time coincidence is increased, and information bits are less likely to be affected by noise. This allowance permits the data processor to be provided with an additional input circuit, if required, which introduces a delay time corresponding to the delay which would be introduced by a single logic gate, or provided with an additional output circuit which introduces a delay time corresponding to the delay time of a single logic gate. Such input and output additional circuits are connected respectively to the input of said input flip-flop and to the output of said output flip-flop.

BRIEF DESCRIPTION OF THE DRAWINGS

The present invention will be described in further detail with reference to the accompanying drawings, in which.

DETAILED DESCRIPTION

Figure 1:
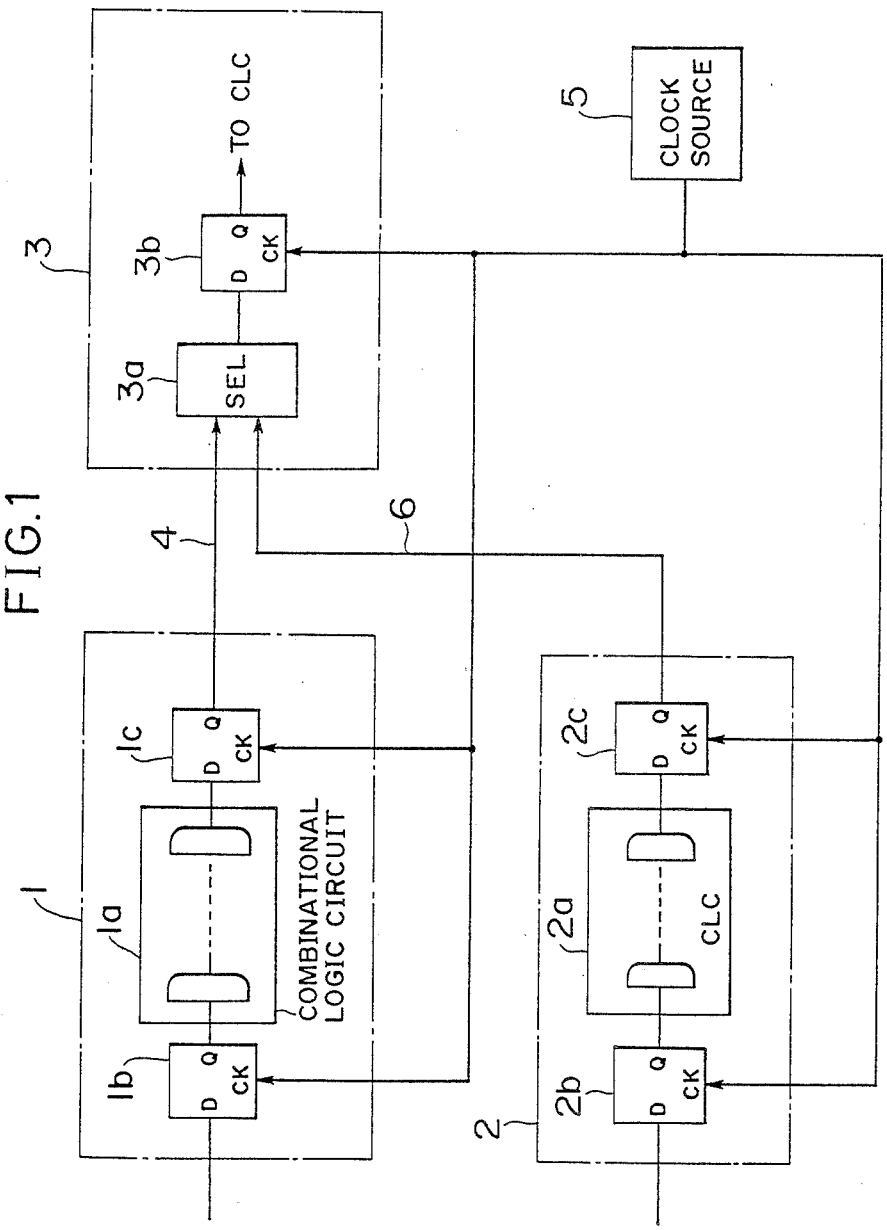
FIG. 1 is a block diagram of a data processor according to an embodiment of the present invention.

In FIG. 1, a data processor of the present invention is illustrated as comprising a plurality of logic integrated circuit chips 1, 2 and 3. For purposes of disclosure, only a representative portion of complex circuitry is shown for each of the integrated circuit chips. The integrated circuit chip 1 is shown as comprising a combinational logic gate circuit 1a, an input-stage D flip-flop 1b and an output-stage D flip-flop 1c. Flip-flop 1b has a data input connected to the input port of the integrated circuit chip 1 and a Q output connected to the input port of the logic gate circuit 1a. Flip-flop 1c has a data input connected to the output port of the logic gate circuit 1a and a Q output connected through the output port of the integrated circuit chip 1 and conductor 4 to the integrated circuit chip 3. Each of the flip-flops 1b and 1c has a clock input connected to a common clock source 5.

Integrated circuit chip 2 is shown as comprising a logic circuit 2a, an input-stage D flip-flop 2b, and an output-stage D flip-flop 2c, all of which are connected in the same manner as the integrated circuit chip 1 with a conductor 6 coupling the Q output of flip-flop 2c to the integrated circuit chip 3.

In the integrated circuit chip 3, a selector 3a which introduces a delay corresponding to one logic gate is provided to selectively receive inputs on conductors 4 and 6 in response to a control signal applied thereto from a circuit, not shown. The output of the selector 3a is connected to an input-stage flip-flop 3b whose Q output is connected to an input of a combinational logic circuit, not shown. All the flip-flops described above operate in synchronism with the system clock provided from the clock source 5.

In a manner well known in the art, each of the flip-flops of all the integrated circuit chips switches to logic-1 output level in response to the leading edge transition of a clock pulse from the clock source 5 in the presence of a logic 1 at the data input of each flip-flop and subsequently switches to logic-0 output level in response to the leading edge transition of the next clock pulse in the presence of a logic 0 at the data input of each flip-flop. Therefore, the duration of the output pulse of each flip-flop is determined exclusively by the interval between successive clock pulses supplied from the clock source. Each of the flip-flops thus generates an output pulse having a consistently equal duration even though the input pulse duration may vary due to delays introduced by intermediate logic gates. With the pulse durations stabilized in this way, each of the integrated circuit chips is allowed a sufficient amount of time "window" necessary for coincidence between the outputs of two or more integrated circuit chips. Due to the increased allowance for time coincidence, the data processor can therefore be operated reliably at increased speeds. Furthermore, additional output circuits can be provided as required, in the conductors 4 and 6.

Figure 2:
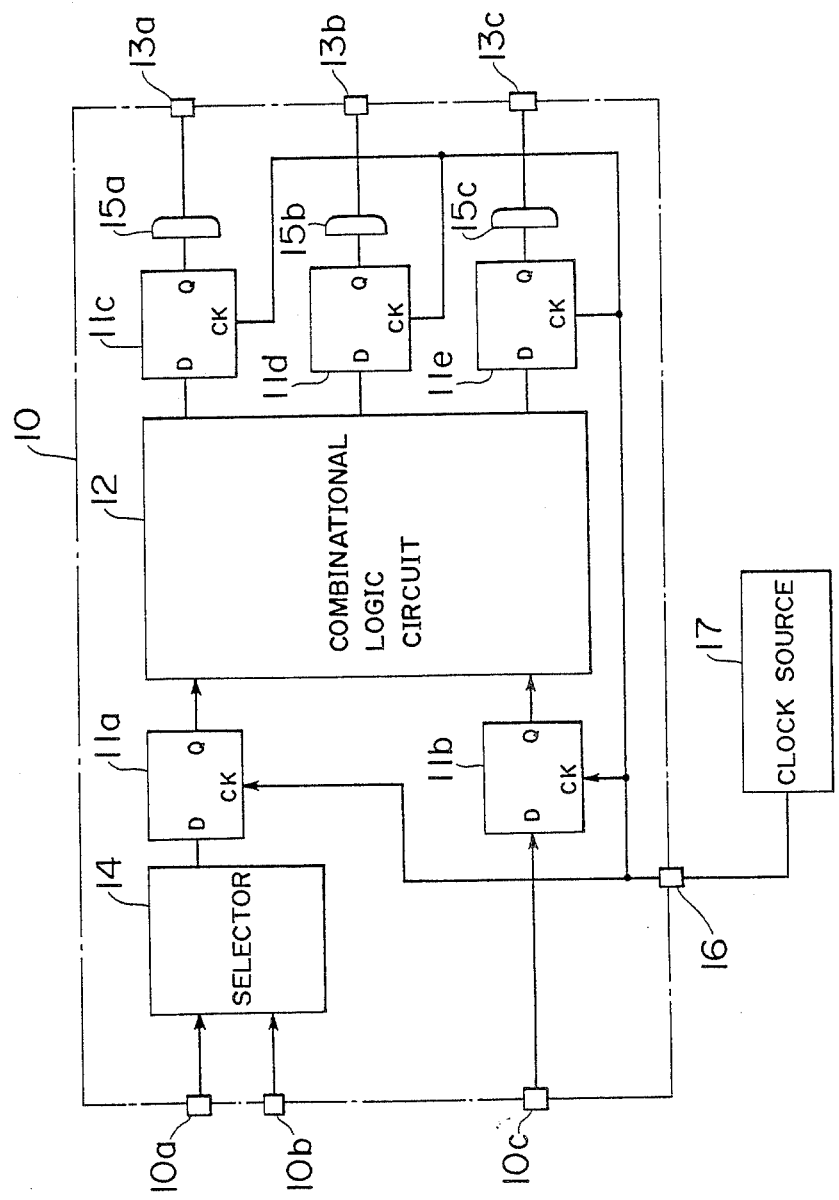
FIG. 2 is a circuit diagram of a logic integrated circuit of FIG. 1.

FIG. 2 is an illustration of details of the integrated circuit chip 3 of FIG. 1 and is indicated by numeral 10. Chip 10 includes an input selector circuit 14 and buffer gates 15a, 15b and 15c. Selector circuit 14 has two inputs connected respectively to input ports, or pads 10a and 10b. Signals applied to pads 10a and 10b are selectively coupled to the output of the selector circuit 14 in response to a control signal applied thereto from a circuit, now shown. The output of selector 14 is connected to the data input of an input-stage D flip-flop 11a whose Q output is connected to a combinational logic circuit 12. Another input-stage D flip-flop 11b is provided having a data input connected to an input pad 10c, the output of the flip-flop 11b being connected to the combinational logic circuit 12. Three output D flip-flops 11c, 11d and 11e are connected to output ports of the logic circuit 12 to supply equal duration pulses to buffer gates 15a, 15b and 15c, respectively. The outputs of these gates are connected to output pads 13a, 13b and 13c, respectively. All the flip-flops 11a to 11e have a clock input connected via port 16 to a common clock source 17.

Even though the inputs to the flip-flops 11a, 11b, 11c, 11d and 11e may have variously shortened pulse durations, these flip-flops correct them by regenerating new output pulses of equal duration determined exclusively by the interval of the clock provided by the common clock source 17.

The foregoing description shows only preferred embodiment of the present invention. Various modifications are apparent to those skilled in the art without departing from the scope of the present invention which is only limited by the appended claims. Therefore, the embodiments shown and described are only illustrative, not restrictive.

What is claimed is:

1. A data processor comprising:
   a clock source for generating clock pulses;
   first and second input-stage integrated circuits chips;
   third output-stage integrated circuit chip; and
   means for connecting an output terminal of said first input-stage integrated circuit chip to an input terminal of said third output-stage integrated circuit chip and for connecting an output terminal of said second input-stage integrated circuit chip to an input terminal of said third output-stage integrated circuit chip,
   at least one of said first and second integrated circuit chips comprising:
      a first logic circuit;
      an input-stage flip-flop having a logic input terminal connected to an input terminal of the chip and a logic output terminal connected to an input of said first logic circuit; and
      an output-stage flip-flop having a logic input terminal connected to an output of said first logic circuit and a logic output terminal, said third integrated circuit chip comprising:
      a selector having first and second inputs connected respectively to the logic output terminals of the output-stage flip-flops of said first and second integrated circuit chips for selectively applying signals from said first and second integrated circuit chips to an output terminal thereof;
      a second logic circuit; and
      an input-stage flip-flop having a logic input terminal connected to the output terminal of said selector and a logic output terminal connected to an input of said second logic circuit,
   each said input-stage flip-flop and each said output-stage flip-flop of said first and second integrated circuit chips being responsive to said clock pulses for changing logic states at their logic output terminals to the logic states of their logic input terminals, and said input-stage flip-flop of said third integrated circuit chip being responsive to said clock pulses for changing a logic state at the logic output terminal thereof to the logic state of the logic input terminal thereof.

* * * * *